(12) United States Patent
Zhang et al.

(10) Patent No.: US 10,101,473 B2
(45) Date of Patent: Oct. 16, 2018

(54) SEMICONDUCTOR DETECTOR

(71) Applicant: Nuctech Company Limited, Beijing (CN)

(72) Inventors: Lan Zhang, Beijing (CN); Yingshuai Du, Beijing (CN); Bo Li, Beijing (CN); Zonggui Wu, Beijing (CN); Jun Li, Beijing (CN); Xuepeng Cao, Beijing (CN); Haifan Hu, Beijing (CN); Jianping Gu, Beijing (CN); Guangming Xu, Beijing (CN); Bicheng Liu, Beijing (CN)

(73) Assignee: Nuctech Company Limited, Beijing (CN)

(*) Notice: Subject to any disclaimer, the term of this patent is extended or adjusted under 35 U.S.C. 154(b) by 0 days.

(21) Appl. No.: 15/606,071

(22) Filed: May 26, 2017

(65) Prior Publication Data
US 2018/0059261 A1 Mar. 1, 2018

(30) Foreign Application Priority Data
Aug. 31, 2016 (CN) .......................... 2016 1 0797083

(51) Int. Cl.
*G01T 1/24* (2006.01)
*H01L 31/02* (2006.01)
*H05K 1/18* (2006.01)
*H05K 1/02* (2006.01)
*H05K 1/11* (2006.01)
(Continued)

(52) U.S. Cl.
CPC .......... *G01T 1/24* (2013.01); *H01L 31/02005* (2013.01); *H01L 31/02966* (2013.01); *H01L 31/119* (2013.01); *H05K 1/028* (2013.01); *H05K 1/0233* (2013.01); *H05K 1/115* (2013.01); *H05K 1/181* (2013.01); *H05K 2201/10151* (2013.01); *H05K 2201/10287* (2013.01); *H05K 2201/10522* (2013.01)

(58) Field of Classification Search
CPC ................. G01T 1/24; H01L 31/02005; H01L 31/02966; H01L 31/119; H05K 1/0233; H05K 1/028; H05K 1/115; H05K 1/181; H05K 2201/10151; H05K 2201/10287; H05K 2201/10522
See application file for complete search history.

(56) References Cited

U.S. PATENT DOCUMENTS 9,835,739 B2 * 12/2017 Zhang ..................... G01T 1/247
2016/0018537 A1 * 1/2016 Zhang ..................... G01T 1/247
250/371

* cited by examiner

*Primary Examiner* — Mark R Gaworecki
(74) *Attorney, Agent, or Firm* — Schwegman Lundberg & Woessner, P.A.

(57) ABSTRACT

The present disclosure provides a semiconductor detector. The semiconductor detector comprises: a detector crystal including a crystal body, an anode and a cathode; a field enhance electrode for applying a voltage to the detector crystal; an insulating material disposed between the field enhanced electrode and a surface of the detector crystal. The semiconductor detector further comprises a field enhanced electrode circuit board having a bottom connection layer in contact with the surface of the detector crystal and a top layer opposite to the bottom connection layer, wherein the top layer is connected to a high voltage input terminal of the semiconductor detector, and an insulating material is provided between the bottom connection layer and the detector surface of the detector crystal.

12 Claims, 3 Drawing Sheets

(a)

(b)

(c)

(51) Int. Cl.
*H01L 31/119* (2006.01)
*H01L 31/0296* (2006.01)

SEMICONDUCTOR DETECTOR

CROSS-REFERENCE TO RELATED APPLICATION(S)

This application claims priority to Chinese Application No. 201610797083.0 filed at Aug. 31, 2016 and entitled "SEMICONDUCTOR DETECTOR", which is incorporated herein by reference in its entirety.

TECHNICAL FIELD

The present disclosure relates to a semiconductor detector, and more particularly to a field-enhanced tellurium-zinc-cadmium semiconductor detector with a wire electrode.

BACKGROUND

A field-enhanced semiconductor detector greatly improves performance of a detector such as energy resolution, peak-to-valley ratio and the like due to its uniform distribution of electric field. However, in practical applications, a high voltage of the field-enhanced electrode is directly connected to sides of the detector by usually using a direct soldering of a high-voltage line, an exposed high pressure will bring security risks, while the installation is not convenient and is not suitable for practical application. Since the high voltage source also carries noise, it increases noise of the detector and also generates a dark current between the field enhanced electrodes to affect the performance of the detector. At the same time, during a drift process of charges, the field enhanced electrode absorbs a part of signals so that a collection efficiency of anodes has been decreased.

SUMMARY

The object of the present invention is to further improve an energy resolution of the field-enhanced tellurium-zinc-cadmium semiconductor detector with a wire electrode, to reduce influence of a dark current in the field enhanced electrode on the detector, and to improve safety and stability of a high-voltage connection of the field-enhanced electrode.

According to one aspect of the present invention, there is proposed a semiconductor detector, especially a field enhanced semiconductor detector.

The semiconductor detector comprises: a detector crystal including a crystal body, an anode and a cathode; a field enhance electrode for applying a voltage to the detector crystal; an insulating material disposed between the field enhanced electrode and a surface of the detector crystal.

Preferably, the insulating material covers an entire surface of the detector crystal at the side of the field enhanced electrode.

Preferably, the detector crystal is a tellurium zinc cadmium crystal.

Preferably, the semiconductor detector further comprises a field enhanced electrode circuit board having a bottom connection layer in contact with the surface of the detector crystal and a top layer opposite to the bottom connection layer, wherein the top layer is connected to a high voltage input terminal of the semiconductor detector, and an insulating material is provided between the bottom connection layer and the detector surface of the detector crystal.

Preferably, the field enhanced electrode circuit board further comprises a plurality of via holes, and the top layer is connected to the bottom connection layer through the via holes.

Preferably, the top layer is connected to an external high voltage source by soldering a patch socket or by a direct soldering.

Preferably, a filter circuit is provided in the high voltage side top layer of the cathode circuit board.

Preferably, the filter circuit utilizes a passive filtering.

Preferably, the filter circuit is provided at an edge of the top layer of the field enhanced electrode circuit board.

Preferably, the field enhanced electrode circuit board is a flexible circuit board.

Preferably, the filter circuit is provided in the flexible circuit board.

Preferably, a voltage dividing circuit is further provided in the top layer, and the voltage dividing circuit supplies power to the field enhanced electrode circuit board together with an independent power source.

The invention adds the insulating material between the field enhanced electrodes and prevents the high voltage noise from entering the detector crystal while providing a uniform electric field for the detector, and prevent the signal in the blocking detector from being absorbed by the field enhanced electrode.

The invention also utilizes a PCB package to provide high voltage to the field enhanced electrode, and the voltage dividing circuit reduces the numbers of the high voltage source. The filter circuit improves a signal to noise ratio of the high voltage, shortens the distance between the detector electrodes, and enhances energy resolution of the detector.

The semiconductor detector and the method for packaging the same according to the present disclosure may provide an optimized field enhanced line electrode CdZnTe tellurium-zinc-cadmium semiconductor detector having a higher energy resolution and operated at room temperature, which may further improve the energy resolution of the field enhanced line electrode detector and reduce the influence of dark current. The invention may be applied in the fields of nuclear radiation detection, radionuclide identification, radiation imaging and nuclear technology application.

DETAILED DESCRIPTION

Figure 1:
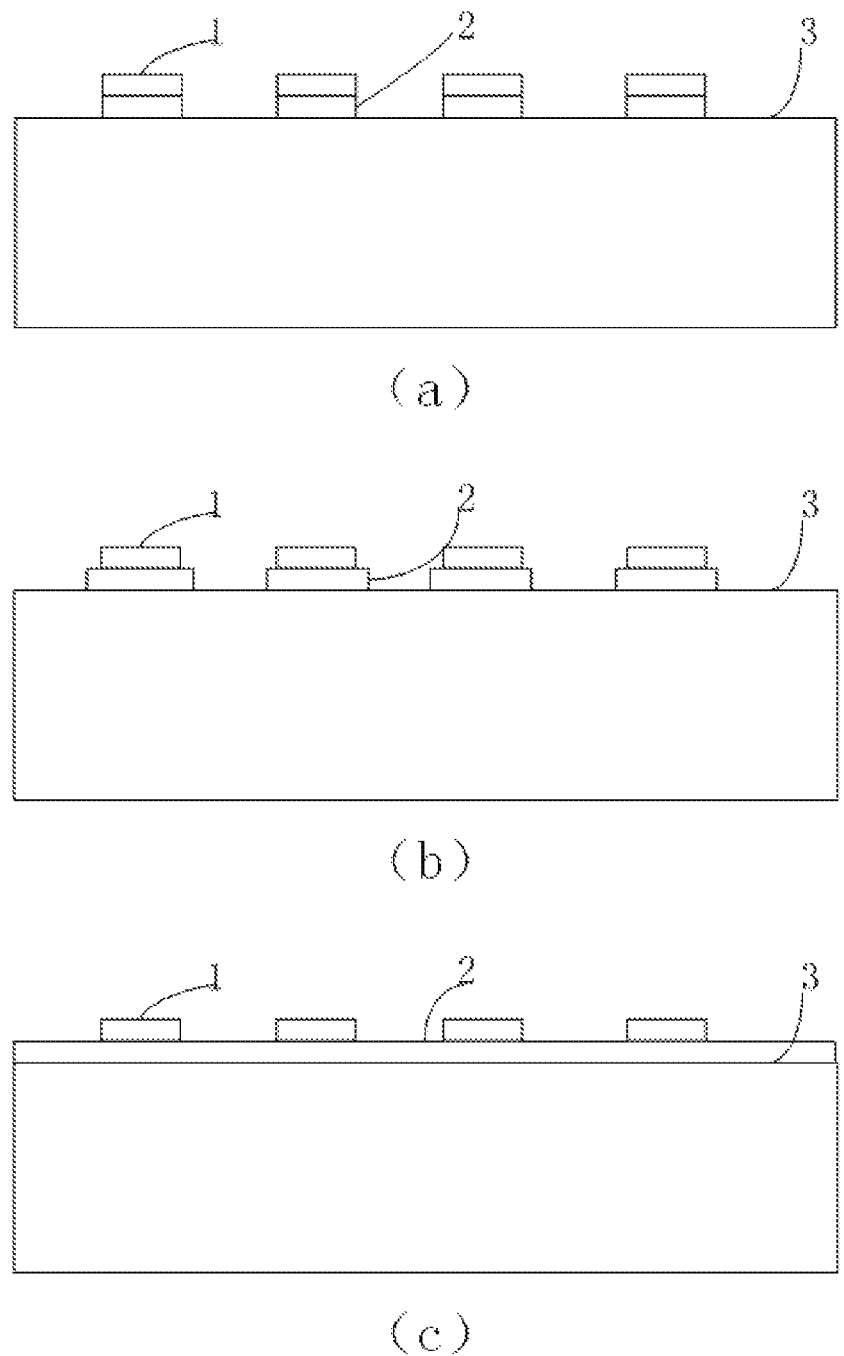
FIG. 1 shows a side view of a structure of a semiconductor detector according to an embodiment of the present invention.

Reference will now be made to the embodiments of the present invention, examples of which are illustrated in the accompanying drawings, wherein like reference numerals refer to similar elements throughout the drawings. The following examples of the present invention will be described with reference to the accompanying drawings.

The present invention adds the insulating material between the field enhanced electrode and the surface of the detector, which may reduce influence of the high voltage noise of the side field enhanced to the detector, reduces the dark current between the field enhanced electrodes and improve the energy resolution of the detector.

FIG. 1 shows a side view of a structure of a semiconductor detector according to an embodiment of the present invention. As shown in FIG. 1, the semiconductor detector comprises a semiconductor detector material 3, which may be CZT (Cadmium zinc telluride), CdTe (cadmium telluride), CdMnTe (cadmium manganese telluride), HgI2 (mercury iodide), TlBr (thallium bromide), PbI2 (lead iodide), GaAs (gallium arsenide), Ge (germanium) and the like; an insulating material 2; and a field enhanced electrode 1. The field enhanced electrode may be connected to different high voltages according to the requirements of the apparatus so that the electric field distribution inside the detectors is uniform and the charge collection efficiency is increased.

In particular, the semiconductor detector comprises: a detector crystal including a crystal body, an anode and a cathode; a field enhanced electrode for applying a voltage to the detector crystal; an insulating material disposed between the field enhanced electrode and a surface of the detector crystal.

Preferably, the detector crystal is a tellurium zinc cadmium crystal.

The insulating material covers an entire surface of the detector crystal at the side of the field enhanced electrode. The shape and size of the insulating material may be consistent with those of the field enhanced electrode. That is to say, a width of the insulating material may be equal to that of the field enhanced line electrode, may be larger than that of the field enhanced line electrode, or may cover the entire surface of a voltage applying surface of the field enhanced electrode. The size of the insulating material is not specifically limited here.

In the existing semiconductor detectors, it is necessary to solder the high voltage terminal to the field enhanced electrode of the detector through the high-voltage wire, and it should be very careful for the soldering and bring inconvenience to the use of the detector. The high-voltage wire will be broken in use and damage the detector.

Figure 2:
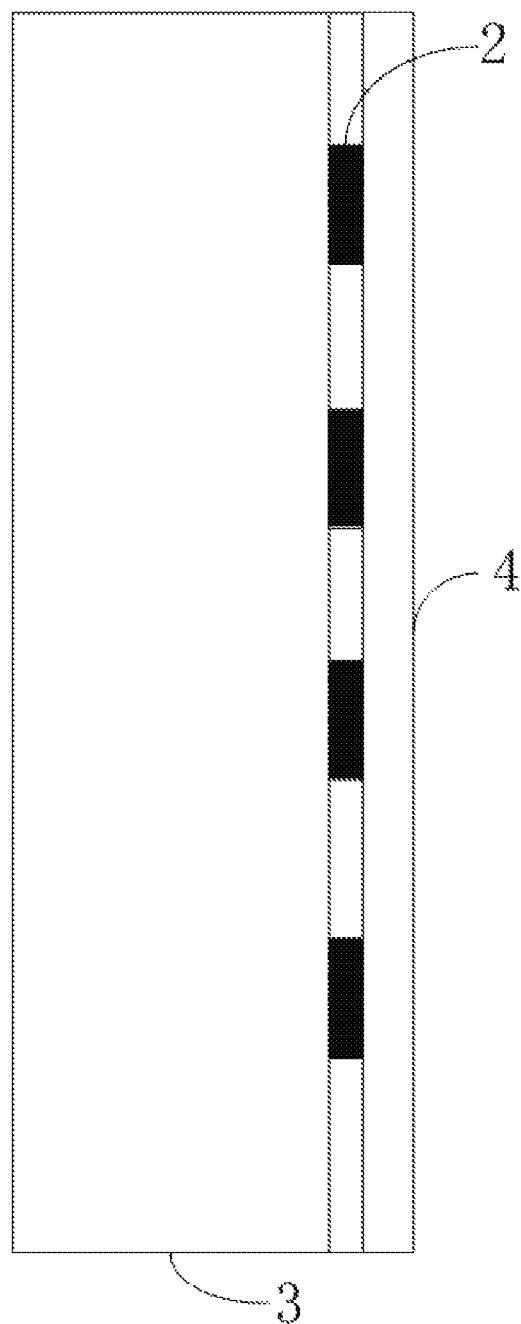
FIG. 2 shows a schematic diagram of package structure of a field enhanced electrode circuit board according to an embodiment of the present invention.

FIG. 2 shows a schematic diagram of package structure of a field enhanced electrode circuit board according to an embodiment of the present invention. The present invention applies a high voltage to the field enhanced electrode by a PCB package. In this way, the side of the PCB board packaged with the detector is the bottom of the PCB, and the other side opposite to the back surface of the PCB is the top layer of the detector. The bottom layer of the PCB is a field enhanced strip electrode of the detector, and there is an insulating material at a portion of the PCB where the PCB is connected with the detector. In particular, the semiconductor detector further comprises a field enhanced electrode circuit board having a bottom connection layer in contact with the surface of the detector crystal and a top layer opposite to the bottom connection layer, wherein the top layer is connected to a high voltage input terminal of the semiconductor detector, and an insulating material is provided between the bottom connection layer and the detector surface of the detector crystal.

The field enhanced electrode circuit board further comprises a plurality of via holes, and the top layer and the bottom connection layer are connected through via holes. The top layer is connected to an external high voltage source by soldering a patch socket or by a direct soldering.

Figure 3:
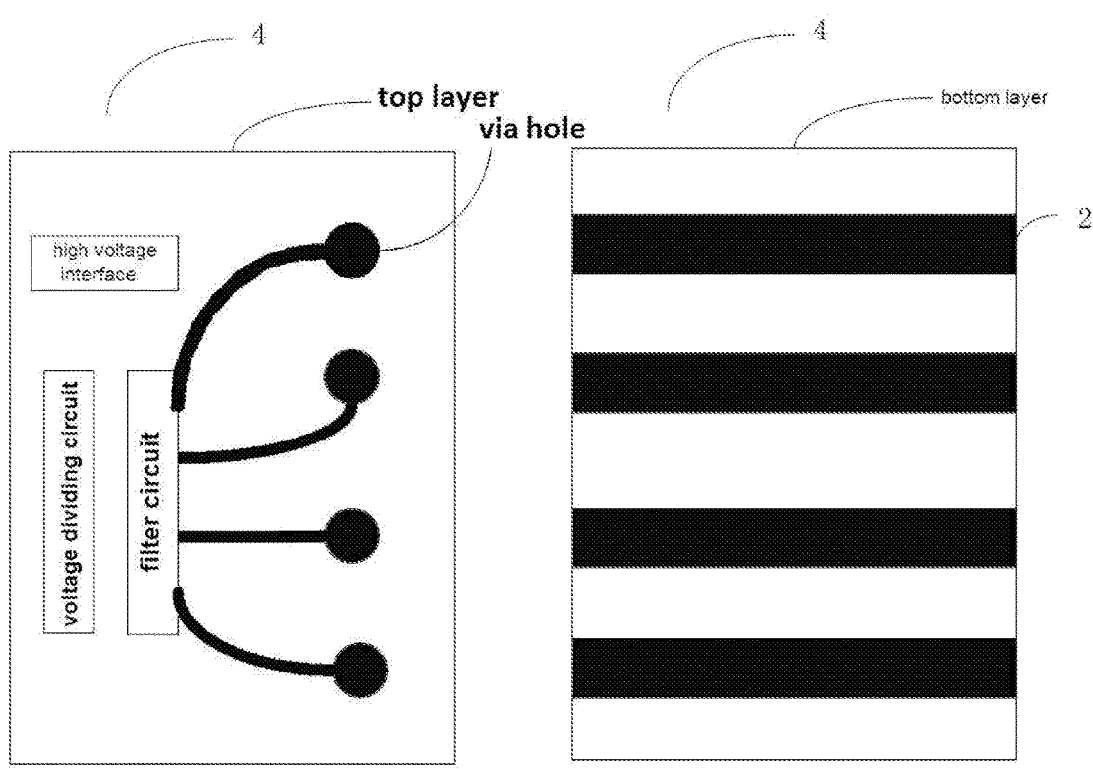
FIG. 3 shows a schematic view of a top layer and a bottom layer of a field enhanced electrode circuit board according to an embodiment of the present invention.

FIG. 3 shows a schematic view of a top layer and a bottom layer of a field enhanced electrode circuit board according to an embodiment of the present invention. The structure of the PCB board is shown in FIG. 3. The top layer comprises a high voltage interface to implement a high voltage connection. The top layer may further comprise a voltage dividing circuit which supplies the high voltage together with an independent power source. The present invention reduces the numbers of the high voltage source and shortens distance between the high voltage source and the electrodes of the detector. A filter circuit is provided in the top layer of the cathode circuit board, which may improve filtering effect and reduce the influence of the high voltage noise to the detector. The high voltage in the top layer is connected to the electrodes in the bottom layer through via holes. The number of via holes is not limited. There may be plenty of via holes and they are distributed in many modes. The design of the electrode in the bottom layer are identical that of the field enhanced electrode of the detector in shape, and may be connected to the detector by adhesives or other connection.

In particular, a filter circuit is provided in the high voltage side top layer of the cathode circuit board. The filter circuit utilizes a passive filtering. The filter circuit is provided at an edge of the top layer of the field enhanced electrode circuit board. The field enhanced electrode circuit board is a flexible circuit board. The filter circuit is provided in the flexible circuit board.

The semiconductor detector and the method for packaging the same according to the present disclosure may provide an optimized field enhanced line electrode CdZnTe tellurium-zinc-cadmium semiconductor detector having a higher energy resolution and operated at room temperature, which may further improve the energy resolution of the field enhanced line electrode detector and reduce the influence of dark current. The invention may be applied in the fields of nuclear radiation detection, radionuclide identification, radiation imaging and nuclear technology application.

Although the present invention has been particularly shown and described with reference to exemplary embodiments thereof, it will be understood by those skilled in the art that various changes and modifications in form and detail may be made without departing from spirit and scope of the invention as defined by the appended claims.

We claim:

1. A semiconductor detector comprising:
   a detector crystal including a crystal body, an anode and a cathode;
   a field enhance electrode for applying a voltage to the detector crystal;
   an insulating material disposed between the field enhanced electrode and a surface of the detector crystal.

2. The semiconductor detector according to claim 1, wherein the insulating material covers an entire surface of the detector crystal at the side of the field enhanced electrode.

3. The semiconductor detector according to claim 1, wherein the detector crystal is a tellurium zinc cadmium crystal.

4. The semiconductor detector according to claim 1, further comprising a field enhanced electrode circuit board having a bottom connection layer in contact with the surface of the detector crystal and a top layer opposite to the bottom connection layer, wherein the top layer is connected to a high voltage input terminal of the semiconductor detector, and an insulating material is provided between the bottom connection layer and the detector surface of the detector crystal.

5. The semiconductor detector according to claim 4, wherein the field enhanced electrode circuit board further comprises a plurality of via holes, and the top layer is connected to the bottom connection layer through the via holes.

6. The semiconductor detector according to claim 4, wherein the top layer is connected to an external high voltage source by soldering a patch socket or by a direct soldering.

7. The semiconductor detector according to claim 4, wherein a filter circuit is provided in the top layer of the field enhanced electrode circuit board.

8. The semiconductor detector according to claim 7, wherein the filter circuit utilizes a passive filtering.

9. The semiconductor detector according to claim 7, wherein the filter circuit is provided at an edge of the top layer of the field enhanced electrode circuit board.

10. The semiconductor detector according to claim 4, wherein the field enhanced electrode circuit board is a flexible circuit board.

11. The semiconductor detector according to claim 10, wherein the filter circuit is provided in the flexible circuit board.

12. The semiconductor detector according to claim 4, wherein a voltage dividing circuit is further provided in the top layer, and the voltage dividing circuit supplies power to the field enhanced electrode circuit board together with an independent power source.

\* \* \* \* \*